(12) United States Patent
Tsai et al.

(10) Patent No.: US 8,455,995 B2
(45) Date of Patent: Jun. 4, 2013

(54) TSVS WITH DIFFERENT SIZES IN INTERPOSERS FOR BONDING DIES

(75) Inventors: Po-Hao Tsai, Zhongli (TW);
Jing-Cheng Lin, Hsin-Chu (TW);
Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 373 days.

(21) Appl. No.: 12/762,085

(22) Filed: Apr. 16, 2010

(65) Prior Publication Data
US 2011/0254160 A1 Oct. 20, 2011

(51) Int. Cl.
*H01L 23/04* (2006.01)

(52) U.S. Cl.
USPC ........... 257/698; 257/774; 257/775; 257/777; 257/E23.067; 257/E23.169; 257/E23.174

(58) Field of Classification Search
USPC ................. 257/698, 737, 774, 775, 777, 778, 257/E23.011, E23.062, E23.063, E23.067, 257/E23.145, E23.169, E23.174
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,391,917 A | 2/1995 | Gilmour et al. | |
| 5,481,133 A | 1/1996 | Hsu | |
| 5,510,298 A | 4/1996 | Redwine | |
| 5,767,001 A | 6/1998 | Bertagnolli et al. | |
| 5,998,292 A | 12/1999 | Black et al. | |
| 6,002,177 A | 12/1999 | Gaynes et al. | |
| 6,184,060 B1 | 2/2001 | Siniaguine | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,322,903 B1 | 11/2001 | Siniaguine et al. | |
| 6,355,501 B1 | 3/2002 | Fung et al. | |
| 6,430,030 B1 * | 8/2002 | Farooq et al. ............ | 361/321.2 |
| 6,434,016 B2 | 8/2002 | Zeng et al. | |
| 6,448,168 B1 | 9/2002 | Rao et al. | |
| 6,448,661 B1 | 9/2002 | Kim et al. | |
| 6,461,895 B1 | 10/2002 | Liang et al. | |
| 6,465,892 B1 | 10/2002 | Suga | |
| 6,472,293 B1 | 10/2002 | Suga | |
| 6,538,333 B2 | 3/2003 | Kong | |
| 6,562,653 B1 | 5/2003 | Ma et al. | |
| 6,570,248 B1 | 5/2003 | Ahn et al. | |
| 6,599,778 B2 | 7/2003 | Pogge et al. | |
| 6,600,222 B1 | 7/2003 | Levardo | |
| 6,607,938 B2 | 8/2003 | Kwon et al. | |
| 6,639,303 B2 | 10/2003 | Siniaguine | |

(Continued)

*Primary Examiner* — Matthew E Warren
(74) *Attorney, Agent, or Firm* — Slater & Matsil, L.L.P.

(57) ABSTRACT

A device includes an interposer including a substrate having a top surface and a bottom surface. A plurality of through-substrate vias (TSVs) penetrates through the substrate. The plurality of TSVs includes a first TSV having a first length and a first horizontal dimension, and a second TSV having a second length different from the first length, and a second horizontal dimension different from the first horizontal dimension. An interconnect structure is formed overlying the top surface of the substrate and electrically coupled to the plurality of TSVs.

20 Claims, 13 Drawing Sheets

U.S. PATENT DOCUMENTS

| | | |
|---|---|---|
| 6,661,085 B2 | 12/2003 | Kellar et al. |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,762,076 B2 | 7/2004 | Kim et al. |
| 6,779,783 B2 | 8/2004 | Kung et al. |
| 6,790,748 B2 | 9/2004 | Kim et al. |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,962,867 B2 | 11/2005 | Jackson et al. |
| 6,962,872 B2 | 11/2005 | Chudzik et al. |
| 6,975,016 B2 | 12/2005 | Kellar et al. |
| 7,030,481 B2 | 4/2006 | Chudzik et al. |
| 7,037,804 B2 | 5/2006 | Kellar et al. |
| 7,049,170 B2 | 5/2006 | Savastiouk et al. |
| 7,056,807 B2 | 6/2006 | Kellar et al. |
| 7,060,601 B2 | 6/2006 | Savastiouk et al. |
| 7,071,546 B2 | 7/2006 | Fey et al. |
| 7,087,538 B2 | 8/2006 | Staines et al. |
| 7,111,149 B2 | 9/2006 | Eilert |
| 7,122,912 B2 | 10/2006 | Matsui |
| 7,151,009 B2 | 12/2006 | Kim et al. |
| 7,157,787 B2 | 1/2007 | Kim et al. |
| 7,193,308 B2 | 3/2007 | Matsui |
| 7,215,033 B2 | 5/2007 | Lee et al. |
| 7,262,495 B2 | 8/2007 | Chen et al. |
| 7,276,799 B2 | 10/2007 | Lee et al. |
| 7,279,795 B2 | 10/2007 | Periaman et al. |
| 7,297,574 B2 | 11/2007 | Thomas et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,335,972 B2 | 2/2008 | Chanchani |
| 7,345,350 B2 | 3/2008 | Sinha |
| 7,355,273 B2 | 4/2008 | Jackson et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,573,136 B2 | 8/2009 | Jiang et al. |
| 7,576,435 B2 | 8/2009 | Chao |
| 7,834,450 B2 | 11/2010 | Kang |
| 8,093,711 B2 * | 1/2012 | Zudock et al. .................. 257/698 |
| 8,143,097 B2 | 3/2012 | Chi et al. |
| 2004/0262735 A1 | 12/2004 | Higashi et al. |
| 2006/0001179 A1 | 1/2006 | Fukase et al. |
| 2008/0303154 A1 | 12/2008 | Huang et al. |
| 2010/0090318 A1 | 4/2010 | Hsu et al. |
| 2010/0090319 A1 | 4/2010 | Hsu et al. |
| 2011/0024888 A1 | 2/2011 | Pagaila et al. |
| 2011/0193221 A1 | 8/2011 | Hu et al. |
| 2011/0193235 A1 | 8/2011 | Hu et al. |
| 2011/0278721 A1 * | 11/2011 | Choi et al. ..................... 257/737 |

* cited by examiner

TSVS WITH DIFFERENT SIZES IN INTERPOSERS FOR BONDING DIES

TECHNICAL FIELD

This disclosure relates generally to integrated circuits, and more particularly to three-dimensional integrated circuits (3DICs) comprising interposers and the method of forming the same.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, these improvements in integration density have come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formations, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increases, both circuit RC delay and power consumption increase.

Three-dimensional integrated circuits (3DICs) were thus formed, wherein two dies may be stacked, with through-silicon vias (TSVs) formed in one of the dies to connect the other die to a package substrate. The TSVs are often formed in device dies after the front-end-of-line (FEOL) process, in which devices, such as transistors are formed, and possibly after the back-end-of-line (BEOL) process, in which the interconnect structures are formed. The formation of the TSVs may cause yield loss of the already-formed dies. Further, since the TSVs are formed in device dies after the formation of integrated circuits, the cycle time for manufacturing is also prolonged.

SUMMARY

In accordance with one aspect, a device includes an interposer including a substrate having a top surface and a bottom surface. A plurality of through-substrate vias (TSVs) penetrates through the substrate. The plurality of TSVs includes a first TSV having a first length and a first horizontal dimension, and a second TSV having a second length different from the first length, and a second horizontal dimension different from the first horizontal dimension. An interconnect structure is formed overlying the top surface of the substrate and electrically coupled to the plurality of TSVs.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel three-dimensional integrated circuit (3DIC) and the method of forming the same are provided. The intermediate stages of manufacturing various embodiments are illustrated. The variations of the embodiments are discussed. Throughout the various views and illustrative embodiments, like reference numbers are used to designate like elements.

Figure 1A:
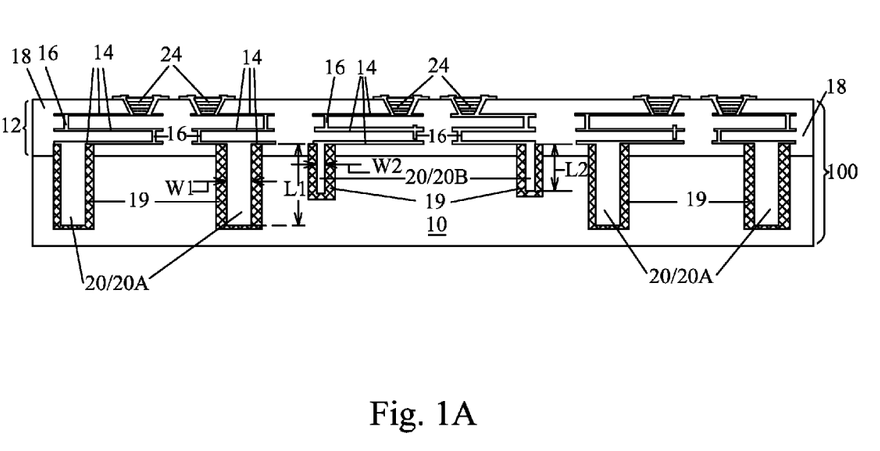
FIGS. 1A through 1K are cross-sectional views of intermediate stages in the manufacturing of a three-dimensional integrated circuit (3DIC) in accordance with various embodiments, wherein one of the dies is located in a recess in the substrate of an interposer.

Referring to FIG. 1A, substrate 10 is provided. Throughout the description, substrate 10 and the corresponding interconnect structures 12 and 32 (not shown in FIG. 1A, please refer to FIG. 3) in combination are referred to as interposer wafer 100. The illustrated structure is only a portion of a chip/die in interposer wafer 100, which includes a plurality of chips identical to the illustrated chip. Substrate 10 may be formed of a semiconductor material, such as silicon, silicon germanium, silicon carbide, gallium arsenide, or other commonly used semiconductor materials. Alternatively, substrate 10 is formed of a dielectric material, such as silicon oxide. Interposer wafer 100 may be substantially free from integrated circuit devices, including active devices, such as transistors and diodes. Furthermore, interposer wafer 100 may include, or may be free from, passive devices, such as capacitors, resistors, inductors, varactors, and/or the like.

Through-substrate vias (TSVs) 20 are formed, and extend into substrate 10. TSVs 20 include large TSVs 20A and small TSVs 20B. The horizontal dimension W1 (which may be a diameter or a length/width, depending on the shape of the respective TSVs) of large TSVs 20A is greater than horizontal dimension W2 of small TSVs 20B. In an embodiment, a ratio of W1/W2 is greater than about 1.5, or even greater than about 2. Further, length L1 of large TSVs 20A is greater than length L2 of small TSVs 20B. In an embodiment, a ratio of L1/L2 is greater than about 1.5, or even greater than about 2. In an exemplary embodiment for forming TSVs 20A and 20B having different sizes, an opening in the photo resist (not shown) that is used for forming the TSV openings may have different horizontal dimensions, for example, with some equal to horizontal size W1 and others equal to horizontal size W2. As a result of the loading effect in the etching process, the TSV openings and the resulting TSV openings for TSVs 20A and 20B will have different horizontal sizes and different depths. Length L2 of small TSVs 20B may thus be controlled by adjusting ratio W1/W2. Each of TSVs 20 is electrically insulated from substrate 10 by insulation layer 19.

Front-side interconnect structure 12 is formed over TSVs 20 and substrate 10, and includes one or more dielectric layer(s) 18, and metal lines 14 and vias 16 in dielectric layer(s) 18. Throughout the description, the side of interposer wafer 100 facing up in FIG. 1 is referred to as a front side, and the side facing down is referred to as a backside. Metal lines 14 and vias 16 are referred to as front-side redistribution lines (RDLs). Front-side RDLs 14/16 are electrically coupled to TSVs 20.

Next, front-side (metal) bumps (or bond pads) 24 are formed on the front side of interposer wafer 100, and are electrically coupled to TSVs 20 and RDLs 14/16. In an embodiment, front-side metal bumps 24 are solder bumps, such as eutectic solder bumps. In alternative embodiments, front-side metal bumps 24 are copper bumps or other metal bumps formed of gold, silver, nickel, tungsten, aluminum, and alloys thereof Front-side metal bumps 24 may, or may not, protrude out of the surface of interconnect structure 12.

Figure 1B:
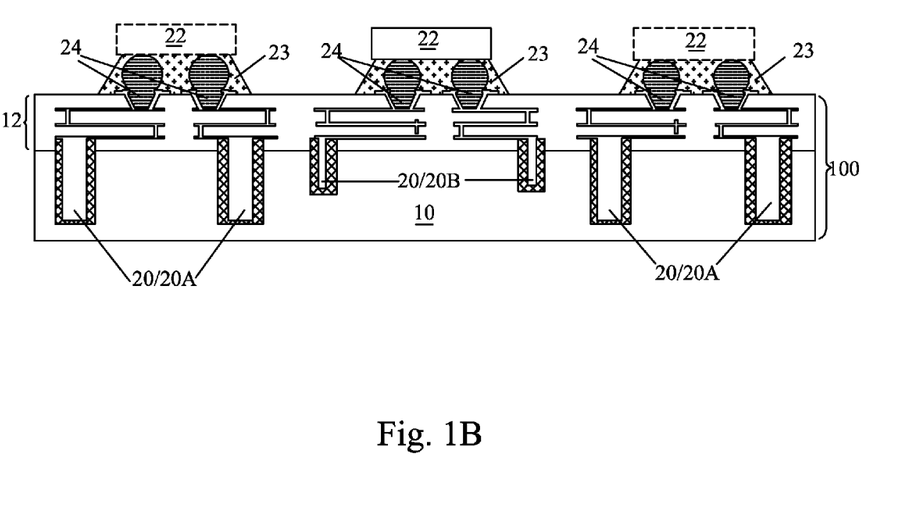

Referring to FIG. 1B, die(s) 22 are bonded to front-side bumps 24. Although FIG. 1B illustrates that three dies are bonded to a same die/chip, in various embodiments, the number of die(s) 22 may range from only one die 22 to multiple dies 22. Dies 22 may be device dies comprising integrated circuit devices, such as transistors, capacitors, inductors, resistors (not shown), and the like. Further, dies 22 may be logic dies comprising core circuits, and may be, for example, center processing unit (CPU) dies. The bonding between dies 22 and metal bumps 24 may be a solder bonding or a direct metal-to-metal (such as a copper-to-copper) bonding. Underfill 23 is dispensed into gaps between die(s) 22 and interposer wafer 100, and is then cured.

Figure 1C:
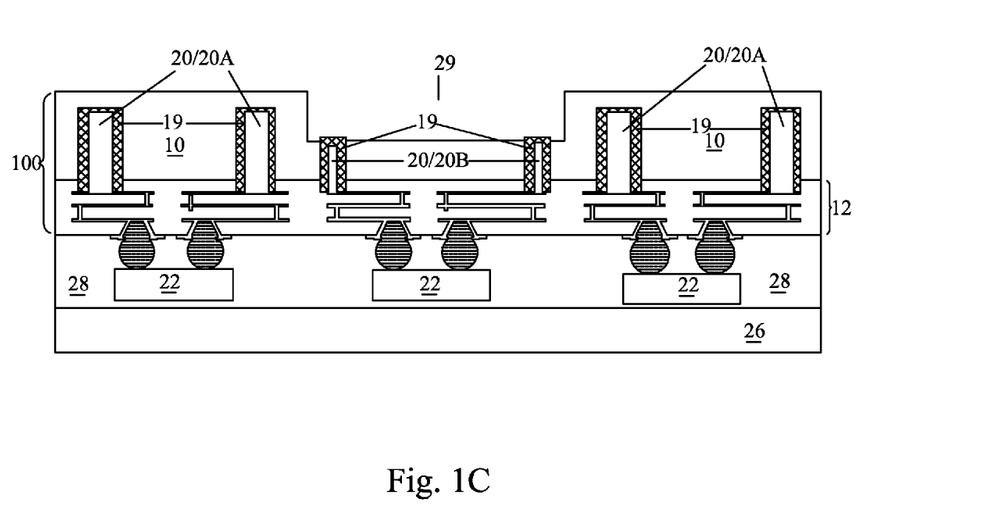

Referring to FIG. 1C, carrier 26, which may be a glass wafer, is bonded onto the front side of interposer wafer 100 through adhesive 28. Adhesive 28 may be an ultra-violet (UV) glue, or may be formed of other known adhesive materials. An etch may be performed to etch a portion of substrate 10 to form recess 29, so that small TSVs 20B, or insulation layers 19 of small TSV 20B, are exposed.

Figure 1D:
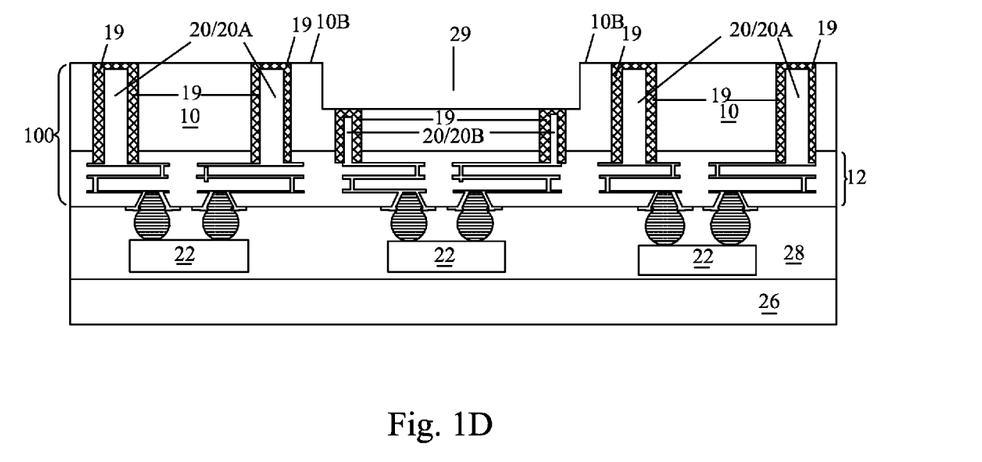
Figure 1E:
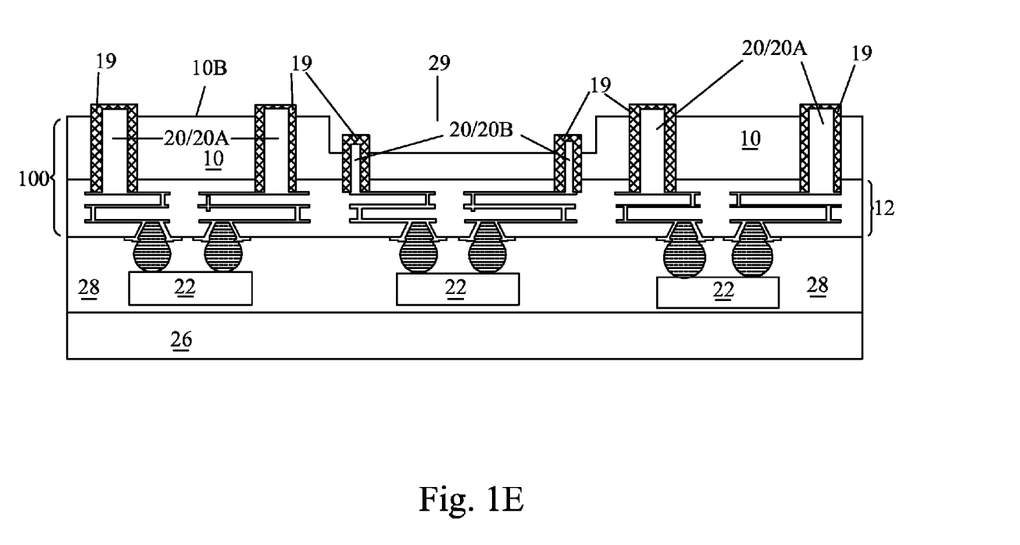
Figure 1F:
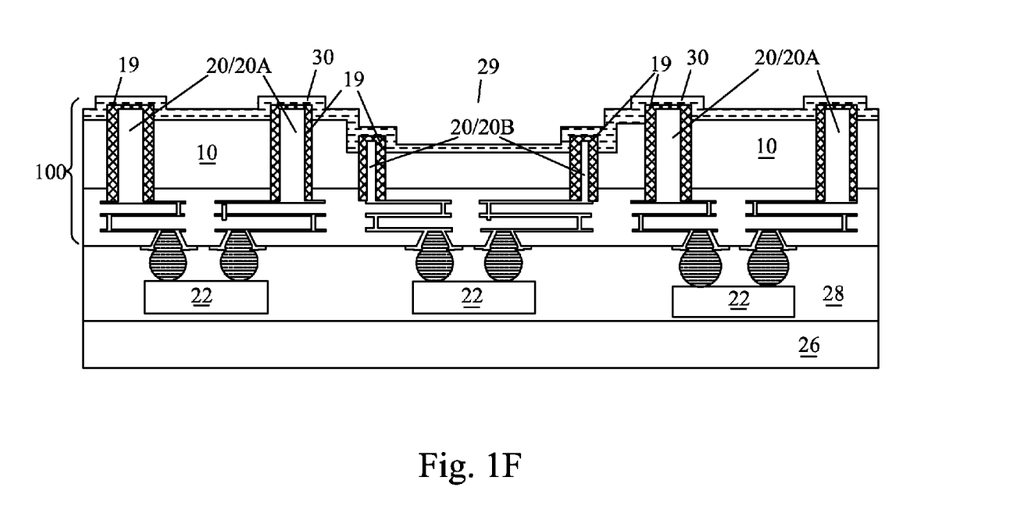

Next, as shown in FIG. 1D, substrate 10 is thinned, for example, by performing a backside grinding on back surface 10B of substrate 10. Back surface 10B may further be etched, as shown in FIG. 1E, so that large TSVs 20A and the respective insulation layer 19 may protrude out of back surface 10B. Referring to FIG. 1F, dielectric layer 30 is blanket formed, wherein dielectric layer 30 may be a spin-on glass or other commonly used dielectric materials.

Figure 1G:
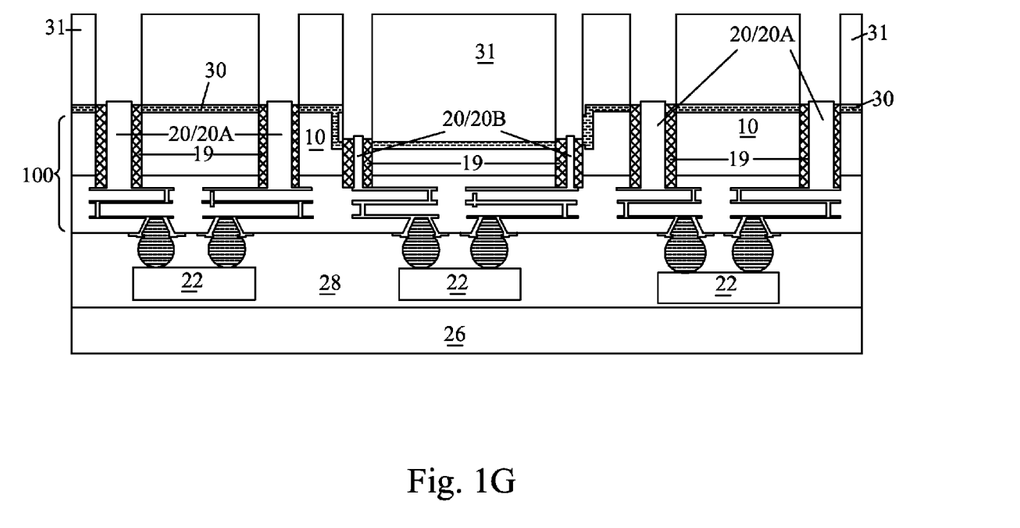

In FIG. 1G, photo resist 31 is formed and patterned, with the openings in photo resist 31 vertically overlapping TSVs 20. An etch is then performed to remove the dielectric materials covering TSVs 20, so that TSVs 20 are exposed.

Figure 1H:
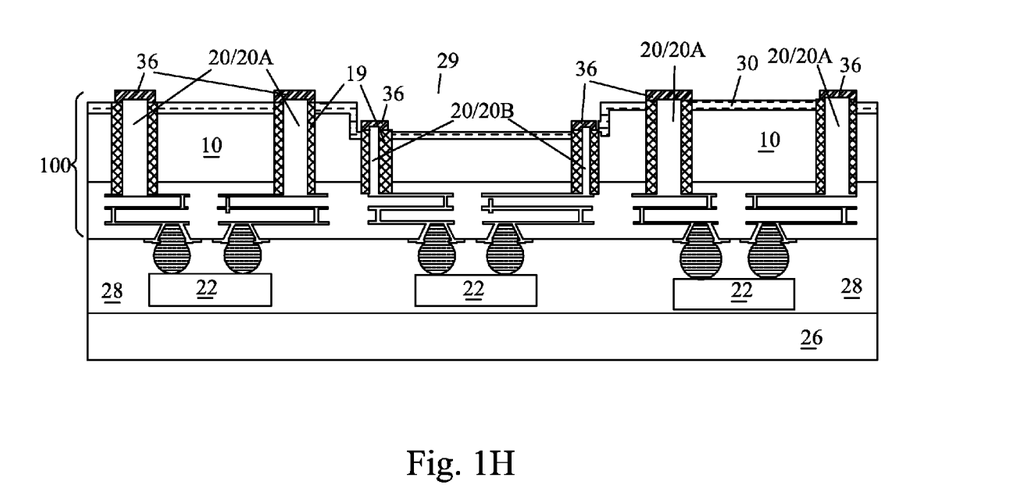

FIG. 1H illustrates the formation of under-bump metallurgies (UBMs) 36. In an embodiment, UBMs 36 are formed of electroless nickel electroless palladium immersion gold (ENEPIG), immersion tin, electroless nickel immersion gold (ENIG), or the like, although other types of materials and methods may be used.

Figure 1I:
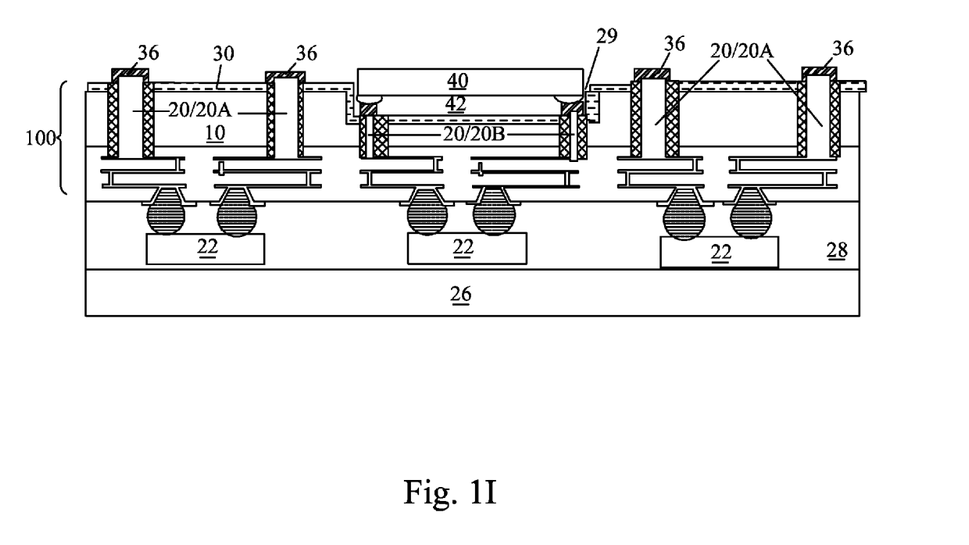

Next, as shown in FIG. 1I, die 40 is bonded to the backside of interposer wafer 100 and is electrically coupled to small TSVs 20B. Die 40 may be electrically coupled to die(s) 22 through front-side interconnect structure 12 and small TSVs 20B. Dies 22 and 40 may be different types of dies. For example, dies 22 may be logic dies, such as CPU dies, while die 40 may be a memory die. Depending on the thickness of substrate 10, the thickness of die 40 and the depth of recess 29, die 40 may be fully or partially inside recess 29. The bonding of die 40 to interposer wafer 100 may be a solder bonding, a direct metal-to-metal bonding, or the like. Next, underfill 42 is dispensed into the gap between die 40 and interposer wafer 100.

Figure 1J:
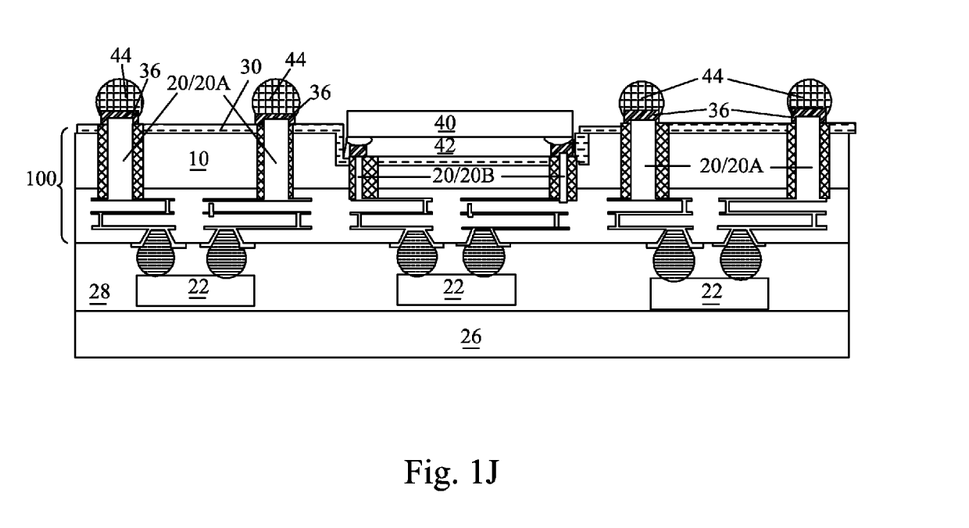

Referring to FIG. 1J, backside metal bumps 44 are formed and are electrically coupled to large TSVs 20A. Similarly, backside metal bumps 44 may be solder bumps, copper bumps, or other metal bumps, such as copper-containing bumps. In various embodiments, a backside interconnect structure (not shown, but similar to interconnect structure 32 in FIG. 3) comprising RDLs in a plurality of dielectric layers may be formed on the backside of interposer wafer 100 and electrically coupling large TSVs 20A to backside metal bumps 44. In these embodiments, backside metal bumps 44 are formed on the surface of the backside interconnect structure.

Figure 1K:
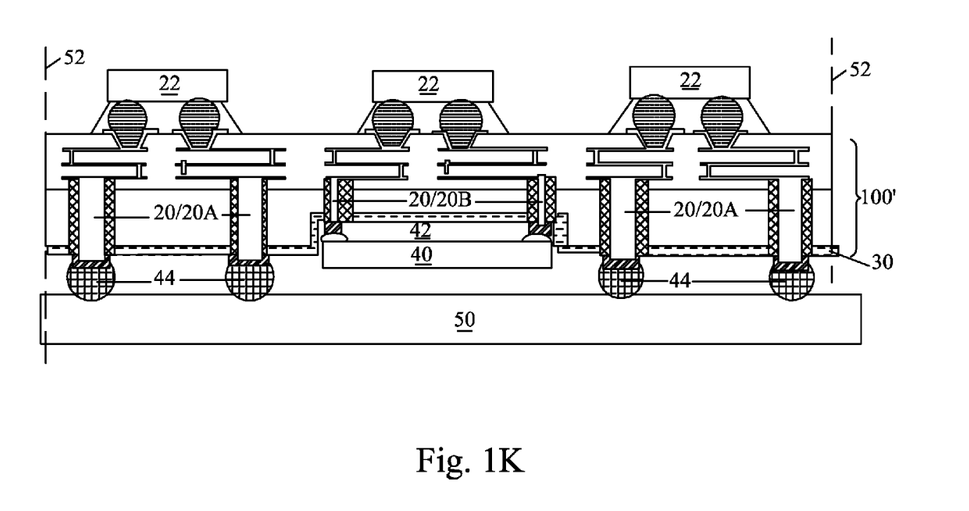

In FIG. 1K, carrier 26 as shown in FIG. 1J is de-bonded, for example, by exposing UV glue 28 to a UV light. Dicing tape (or a temporary carrier) 50 is then adhered to the front side of the resulting structure. Next, a dicing is performed along scribe lines 52 to separate the illustrated die from interposer wafer 100. Each of the resulting dies includes one of interposer die 100', one or more die 22, and die 40.

Figure 2A:
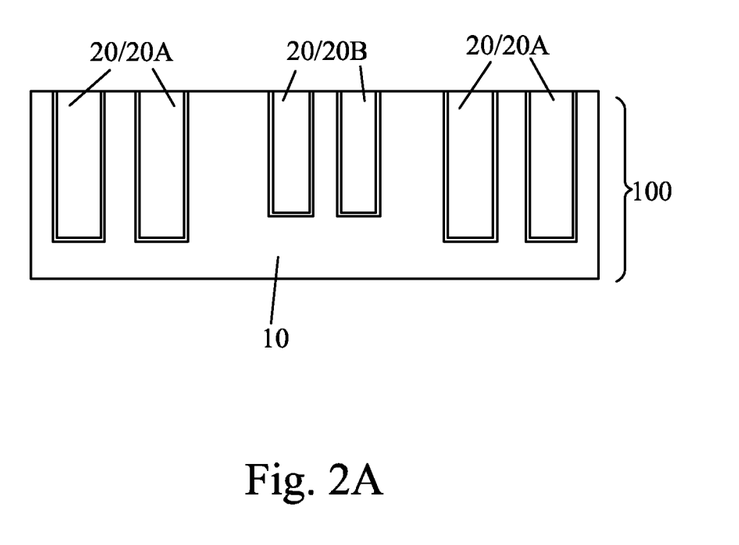
FIGS. 2A through 2K are cross-sectional views of intermediate stages in the manufacturing of a 3DIC in accordance with various embodiments, wherein one of the dies is located in a molding compound of an interposer, and wherein through-substrate vias extend into the molding compound.
Figure 2B:
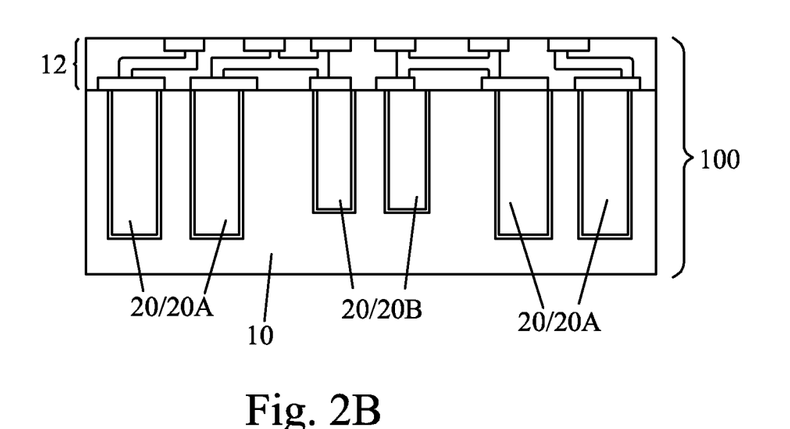
Figure 2C:
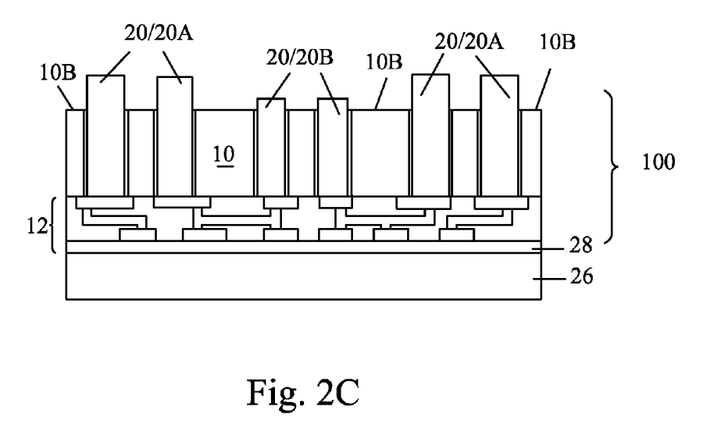

FIGS. 2A through 2K illustrate alternative embodiments. Unless specified otherwise, like reference numerals in these embodiments represent like elements in the embodiments shown in FIGS. 1A through 1K. The details of forming like elements may also be found in the embodiments shown in FIGS. 1A-1K, and hence may not be repeated herein. Referring to FIG. 2A, large TSVs 20A and small TSVs 20B are formed in substrate 10 of interposer wafer 100. The dimension of TSVs 20A and 20B have been discussed in the embodiments shown in FIGS. 1A-1K, and hence are not discussed herein. Referring to FIG. 2B, front-side interconnect structure 12 is formed on substrate 10 and is electrically coupled to TSVs 20A and 20B. Next, as shown in FIG. 2C, carrier 26 is bonded onto the front side of interposer wafer 100 through adhesive 28, followed by a thinning process. The thinning process may include a grinding and/or an etching. After the thinning process, both large TSVs 20A and small TSVs 20B protrude out of back surface 10B of substrate 10. In the thinning process, an entirety of back surface 10B of substrate 10 of the entire chip/die, or even of the entire interposer wafer 100, is recessed, and the resulting back surface 10B of substrate 10 may be substantially flat except the protruding TSVs 20.

Figure 2D:
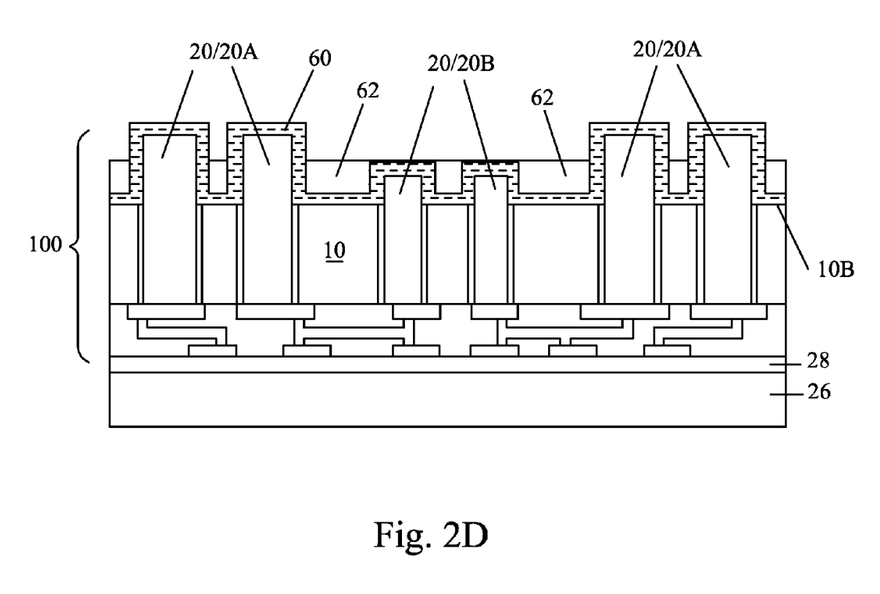
Figure 2E:
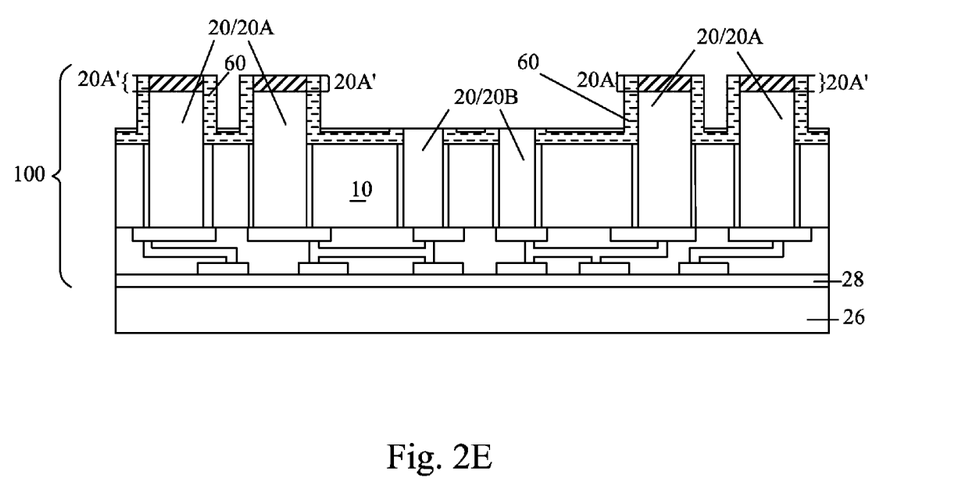

Next, as shown in FIG. 2D, dielectric layer 60 is blanket formed to cover TSVs 20 and back surface 10B. In an embodiment, dielectric layer 60 is formed of silicon nitride, although other dielectric materials may be used. Photo resist 62 is then coated. Next, as shown in FIG. 2E, an etching is performed to remove top portions of dielectric layer 60, so that TSVs 20 may be exposed. It is observed that during the etching process, top portions 20A' of large TSVs 20A may be oxidized, and hence a metal oxide, such as a copper oxide, may be formed.

Figure 2F:
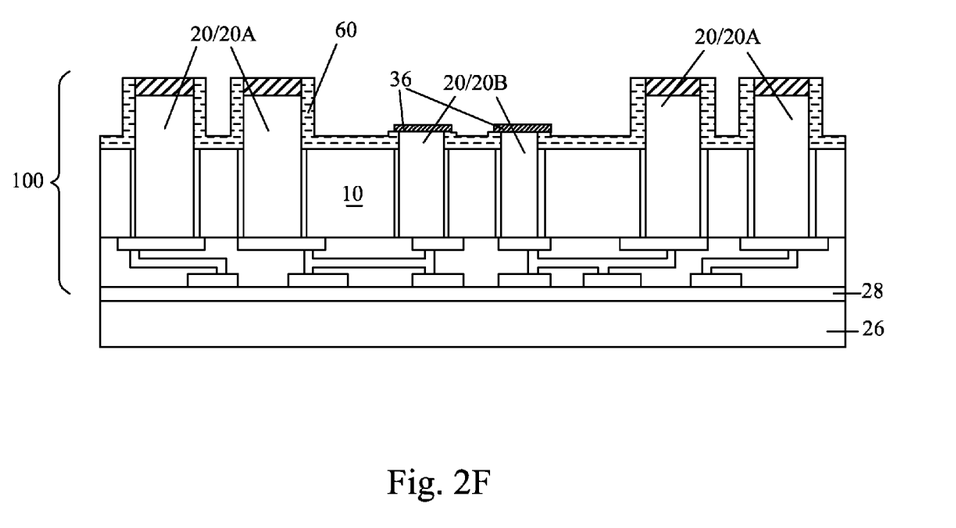
Figure 2G:
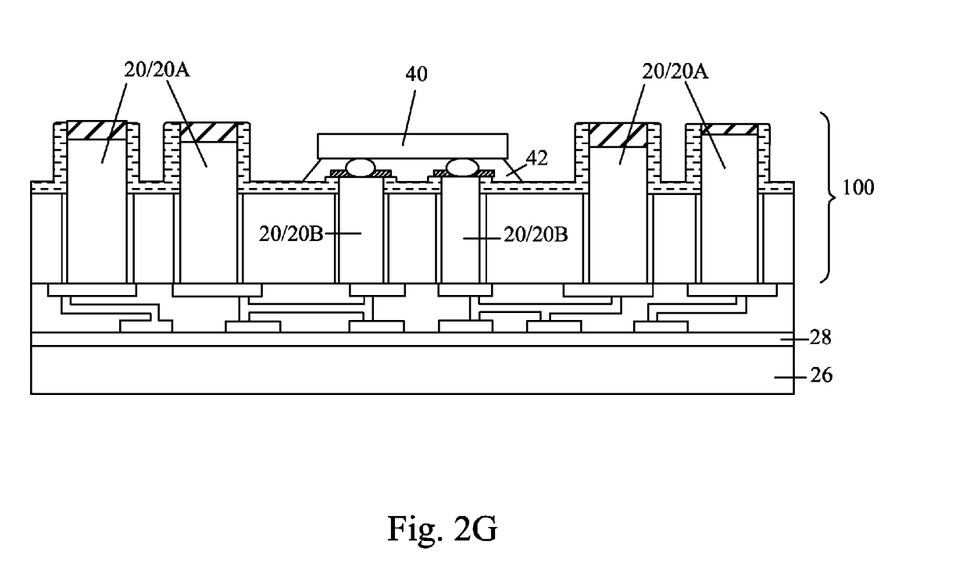

FIG. 2F illustrates the formation of UBMs 36 on small TSVs 20B, wherein the materials and the formation methods of UBMs 36 may be essentially the same as in FIG. 1H. However, no UBMs are formed on large TSVs 20A due to the formation of the metal oxide. In FIG. 2G, die 40 is bonded onto interposer wafer 100 and is electrically coupled to small TSVs 20B. Underfill 42 may then be applied.

Figure 2H:
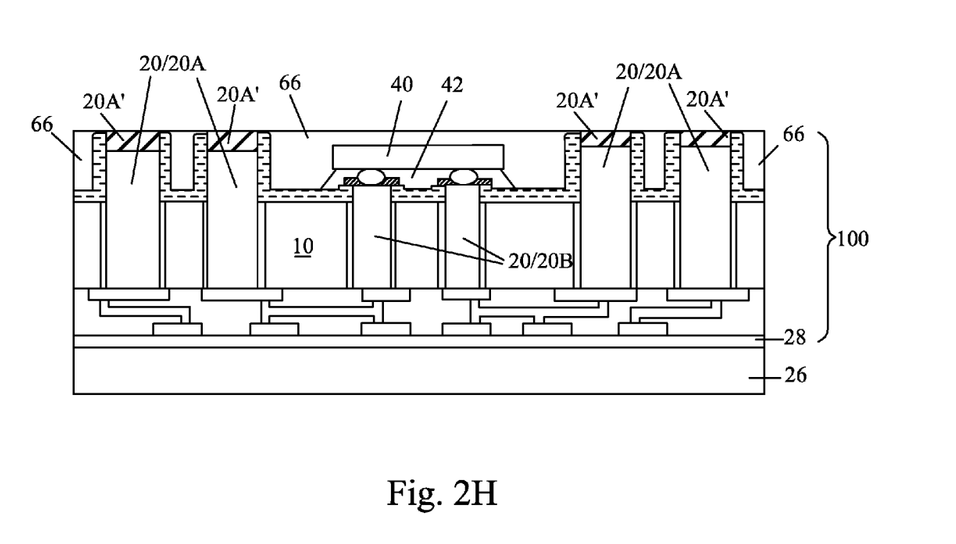
Figure 2I:
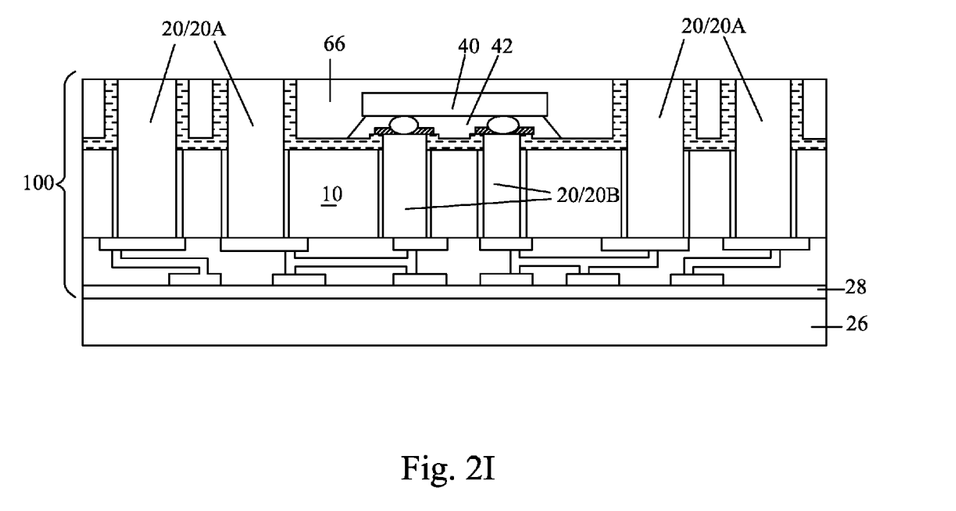
Figure 2J:
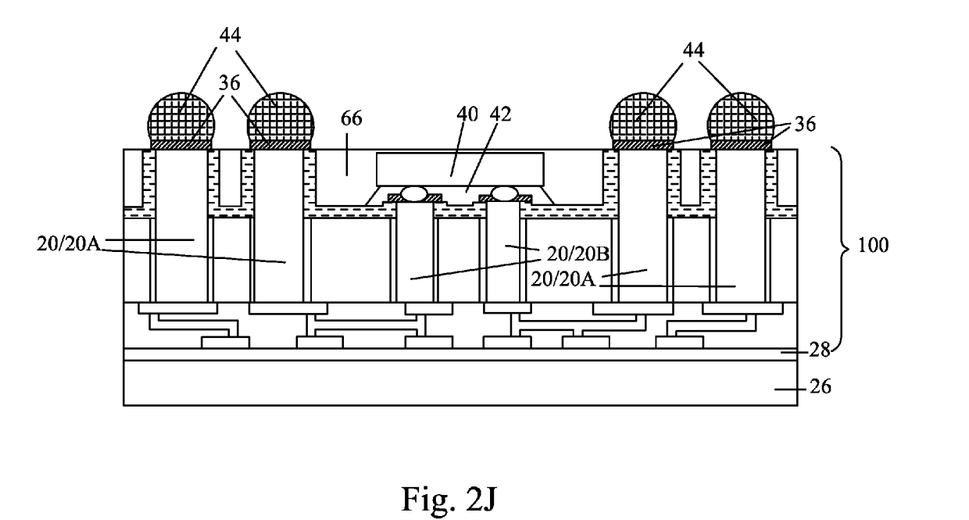

Referring to FIG. 2H, molding compound 66 is molded onto die 40 and interposer wafer 100. A top surface of molding compound 66 may be higher than, or level with, the top surfaces of large TSVs 20A. Referring to FIG. 2I, a grinding is performed to planarize the surface of molding compound 66 and large TSVs 20A. Further, the oxidized top portions 20A' of large TSVs 20A are also removed by the grinding, until the un-oxidized portions are exposed. Next as shown in FIG. 2J, UBMs 36 are formed to cover large TSVs 20A, followed by the formation of backside metal bumps 44, which are electrically coupled to large TSVs 20A.

Figure 2K:
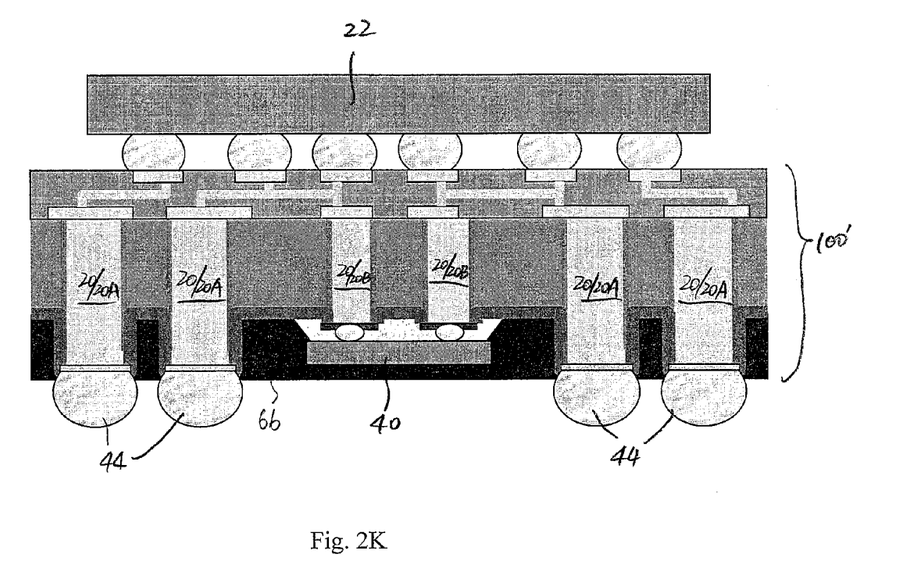

FIG. 2K illustrates the de-bonding of carrier 26 and the bonding of die(s) 22 to the front side of interposer wafer 100. In subsequent process steps, interposer wafer 100 is diced, with each of the resulting dies comprising die 22, die 40, and interposer (die) 100', which is a portion of interposer wafer 100. In the resulting structure, it is observed that large TSVs 20A penetrate both substrate 10 and molding compound 66, and molding compound 66 encircles a portion of each of large TSVs 20A. Further, bottom ends of large TSVs 20A may extend below a bottom surface of die 40.

Figure 3:
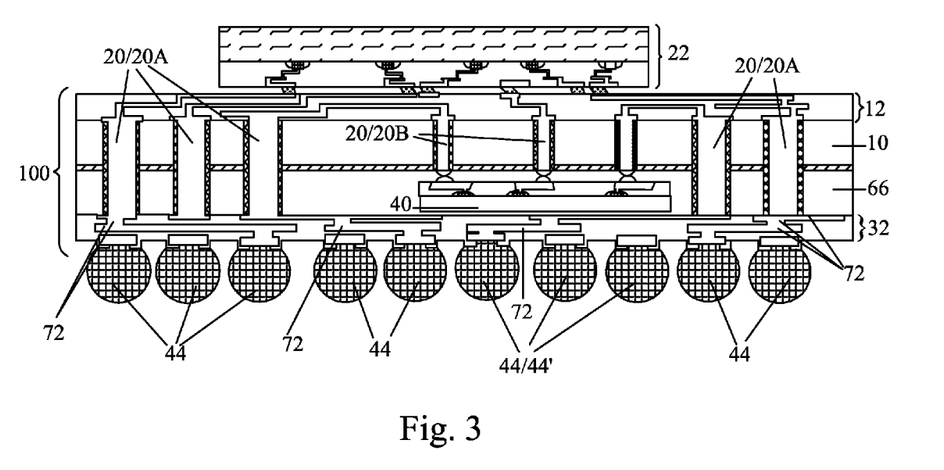
FIG. 3 illustrates a variation of the structure shown in FIG. 2K, wherein an interconnect structure is formed on a surface of the molding compound.

FIG. 3 illustrates an alternative embodiment. This embodiment is similar to the embodiment shown in FIG. 2K, except backside interconnect structure 32 is also formed on the backside of interposer wafer 100. Backside interconnect structure 32 includes a plurality of RDLs 72 in a plurality of dielectric layers. It is observed that some of backside metal bumps 44 (marked as 44') may vertically overlap portions of die 40, and hence the number of backside metal bumps 44 is increased over that of the structure shown in FIG. 2K. Further, backside metal bumps 44 are electrically coupled to RDLs 72, which may further include a portion vertically overlapping die 40.

In the embodiments, TSVs with different sizes are formed and are electrically coupled to die 40 that is either embedded in substrate 10 of the interposer, or in the molding compound that is filled between large TSVs 20A. Accordingly, the thickness of die 40 is not limited by the size of backside metal bumps 44. Further, in the embodiments, the formation of large TSVs 20A and small TSVs 20B are self-controlled by the horizontal sizes, and hence the manufacturing cost is reduced.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    an interposer comprising a substrate having a top surface and a bottom surface, wherein the interposer is substantially free from integrated circuit devices formed therein;
    a plurality of through-substrate vias (TSVs) penetrating through the substrate, wherein the plurality of TSVs comprises a first TSV having a first length and a first horizontal dimension, and a second TSV having a second length different from the first length, and a second horizontal dimension different from the first horizontal dimension; and
    a first interconnect structure formed overlying the top surface of the substrate and electrically coupled to the plurality of TSVs.

2. The device of claim 1, wherein the first horizontal dimension is greater than the second horizontal dimension of the second TSV.

3. The device of claim 2, wherein a ratio of the first horizontal dimension to the second horizontal dimension is greater than about 1.5.

4. The device of claim 1, wherein the first length is greater than the second length.

5. The device of claim 1 further comprising:
    a first die overlying the first interconnect structure; and
    a second die underlying the bottom surface of the substrate and electrically coupled to the second TSV.

6. The device of claim 5, wherein the second die is bonded to the second TSV.

7. The device of claim 5 further comprising a molding compound underlying the bottom surface of the substrate, wherein the first TSV extends to penetrate the molding compound.

8. The device of claim 7, wherein the second die is formed in the molding compound.

9. The device of claim 8 further comprising a metal bump on a bottom surface of the molding compound and electrically coupled to the first TSV.

10. The device of claim 7 further comprising a second interconnect structure underlying the molding compound and electrically connected to the first TSV.

11. The device of claim 10 further comprising a metal bump underlying the second interconnect structure and electrically coupled to the first TSV.

12. The device of claim 5, wherein the substrate comprises a recess extending from the bottom surface of the substrate into the substrate, and wherein at least a portion of the second die is located in the recess.

13. The device of claim 1, wherein the substrate comprises a semiconductor substrate, and wherein the interposer is substantially free from active devices therein.

14. The device of claim 13, wherein the substrate comprises a silicon substrate.

15. A device comprising:
    an interposer comprising a substrate having a top surface and a bottom surface;
    a plurality of through-substrate vias (TSVs) penetrating through the substrate, wherein the plurality of TSVs comprises a first TSV having a first length and a first horizontal dimension, and a second TSV having a second length different from the first length, and a second horizontal dimension different from the first horizontal dimension;
    a molding compound underlying the bottom surface of the substrate, wherein the first TSV extends to penetrate the molding compound;
    a first interconnect structure formed overlying the top surface of the substrate and electrically coupled to the plurality of TSVs;
    a first die overlying the first interconnect structure; and
    a second die underlying the bottom surface of the substrate and electrically coupled to the second TSV.

16. The device of claim 15, wherein the second die is formed in the molding compound.

17. The device of claim 15 further comprising a metal bump on a bottom surface of the molding compound and electrically coupled to the first TSV.

18. The device of claim 15 further comprising a second interconnect structure underlying the molding compound and electrically connected to the first TSV.

19. A device comprising:
- a interposer comprising a substrate having a top surface and a bottom surface, wherein the substrate comprises a recess extending from the bottom surface of the substrate into the substrate;
- a plurality of through-substrate vias (TSVs) penetrating through the substrate, wherein the plurality of TSVs comprises a first TSV having a first length and a first horizontal dimension, and a second TSV having a second length different from the first length, and a second horizontal dimension different from the first horizontal dimension;
- a first interconnect structure formed overlying the top surface of the substrate and electrically coupled to the plurality of TSVs;
- a first die overlying the first interconnect structure; and
- a second die underlying the bottom surface of the substrate and electrically coupled to the second TSV, wherein at least a portion of the second die is located in the recess.

20. The device of claim 19 further comprising a molding compound underlying the bottom surface of the substrate, wherein the first TSV extends to penetrate the molding compound, wherein the second die is disposed in the molding compound.

* * * * *